United States Patent
Liao et al.

[11] Patent Number: 5,903,047
[45] Date of Patent: May 11, 1999

[54] LOW TEMPERATURE-DEPOSITED PASSIVATION FILM OVER SEMICONDUCTOR DEVICE

[75] Inventors: Wen-Shiang Liao, Miao-Li Hsien; Si-Chen Lee, Taipei, both of Taiwan

[73] Assignee: National Science Council, Taipei, Taiwan

[21] Appl. No.: 08/802,362

[22] Filed: Feb. 19, 1997

[30] Foreign Application Priority Data

Jan. 3, 1997 [TW] Taiwan ................................ 86100007

[51] Int. Cl.⁶ .................................................. H01L 23/58
[52] U.S. Cl. ........................... 257/632; 257/646; 257/57; 438/763; 438/786
[58] Field of Search .................... 257/632, 59, 57, 257/750, 646, 52; 438/646, 52, 764, 758, 38, 763, 786

[56] References Cited

U.S. PATENT DOCUMENTS

| | | |
|---|---|---|
| 4,254,426 | 3/1981 | Pankove ................................. 438/763 |
| 4,518,670 | 5/1985 | Matsuzaki et al. . |
| 4,609,930 | 9/1986 | Yanazaki ..................................... 257/59 |
| 4,722,879 | 2/1988 | Ueno et al. . |
| 5,075,244 | 12/1991 | Sakai et al. ................................ 257/59 |
| 5,194,349 | 3/1993 | Tsuo et al. ................................. 430/21 |
| 5,525,813 | 6/1996 | Miyake et al. ............................ 257/59 |

FOREIGN PATENT DOCUMENTS

69-224267  3/1988  Japan ..................................... 257/632

Primary Examiner—Donald L. Monin, Jr.
Assistant Examiner—Phat X. Cao
Attorney, Agent, or Firm—Townsend and Townsend and Crew LLP

[57] ABSTRACT

The present invention provides a composite passivation film deposited at low temperatures (<150° C.). A hydrogenated amorphous silicon nitride (a-SiN$_x$:H) film is formed over a semiconductor device. Then a very thin layer (>6.4 nm) of an amorphous silicon hydrogen (a-Si:H) film is formed over the a-SiN$_x$:H film. Such a composite passivation film can prevent semiconductor devices from oxidation due to percolation of moisture, and maintain the electric properties and stability of the semiconductor devices.

18 Claims, 10 Drawing Sheets

LOW TEMPERATURE-DEPOSITED PASSIVATION FILM OVER SEMICONDUCTOR DEVICE

BACKGROUND OF THE INVENTION

1. Field of the Invention

The present invention relates to a composite passivation film deposited over a semiconductor device, which is deposited at a low temperature below 150° C.

2. Description of the Prior Art

Hydrogenated amorphous silicon nitride (a-SiN$_x$:H) film fabricated by plasma-enhanced chemical vapor deposition (PECVD) at about 250° C.–350° C. is widely used as the final passivation layer for microelectronic devices due to its ability to prevent scratches and protect the devices from outside contaminants such as sodium and potassium ions and moisture. For example, at the final stage for fabricating an amorphous silicon hydrogen thin-film transistor (a-Si:H TFT), a heat- and water-resistant a-SiN$_x$:H film deposited by PECVD is usually coated on the a-Si:H TFT to prevent the transistor from degradation due to percolation of moisture and of salts in the moisture into the interior a-Si:H active interface, thus maintaining the electric properties of the transistor.

However, in certain circumstances, it s not suitable to grow an a-SiN$_x$:H cassivation layer at such high temperatures as 250° C.–350° C. For a semiconductor device Having an a-Si:H interface, such as an a-Si:H thin-film transistor and an a-Si:H solar cell, it has been reported that the diffusion between the metal source/drain and a-Si:H interface initiates at temperatures below 180° C. Aluminum and a-Si:H even diffuse at about 150° C. Relative descriptions can be found in Haque, et al. *J. Appl. Phys.* 75, 3928 (1994; Ishihara, et al., *Thin Solid Films*, 155, 325 (1987); and Ishihara, et al., *J. Appl. Phys.* 53, 3909 (1982). Furthermore, for the highest electrically conductive gold (Au) contacts, the interaction of Au/a-Si:H begins at an even lower temperature of 130° C. (Hentzell, et al., *Appl. Phys. Lett.* 50, 933 (1987)).

Therefore, when aluminum or gold is used as the contact metal, if a-SiN$_x$:H film is deposited at a high temperature (250° C.–350° C.), then diffusion between silicon and metal will occur, and the electric properties of the semiconductor device will be degraded. For the reasons above, to the semiconductor device having the a-Si:H interface, if aluminum or gold is used as the contact metal, it is not suitable to deposit a-SiN$_x$:H passivation film at such high temperatures as 250° C.–350° C.

Hence, researchers have sought to deposit a-SiN$_x$:H passivation film at a temperature below 150° C. However, it has been found that the lower-temperature (15° C.) deposited a-SiN$_x$:H film tends to be oxidized by the moisture (water) in the air, and finally oxidized into a-SiO$_x$:H (Liao, et al., Appl. Phys. Lett., 65, 2229 (1994); and Liao, et al., J. Appl. Phys. 80 (2), Jul. 15, 1996). That is because the lower-temperature (15° C.–150° C.) deposited PECVD a-SiN$_x$:H material has a looser porous structure. Therefore, when exposed to the air, moisture from the air will gradually percolate through numerous microvoids and microchannels and eventually oxidize the whole film in a layer-by-layer fashion. Also, the oxidation rate increases when the deposition temperature decreases. For example, the 880 nm thick PECVD a-SiN$_x$:H film grown at 150° C. tends to be totally oxidized within one month, and the 910 nm thick PECVD a-SiN$_x$:H film grown at a still lower temperature of 100° C. is oxidized even more quickly (within one day the whole film was oxidized) Liao, et al., *Appl. Phys. Lett.* 65 (17), Oct. 24, 1994.

When a substrate is deposited with a-SiN$_x$:H material by PECVD, the reaction radicals directly fall onto and randomly deposited on the substrate. Therefore, if the a-SiN$_x$:H film is deposited at a higher substrate temperature, higher moving energy is provided to these radicals such as SiH2· and NH·); thus, the radicals have higher surface mobility with which to find the most suitable place for binding. However, if a-SiN$_x$:H is deposited at a lower substrate temperature, the film has a looser and more porous structure. Consequently, the water molecules in the air more easily percolate into the film to oxidize it.

Therefore, if a low-temperature (<150° C.) deposited a-SiN$_x$:H film is used as the protective layer for the semiconductor device, it will be quickly percolated by the water molecules in the air and be oxidized, thereby adversely affecting the electric properties and stability of the semiconductor devices.

SUMMARY OF THE INVENTION

An object of the present invention is to solve the above-mentioned problems and to provide a composite passivation film for protecting a semiconductor device. Such composite passivation film includes at least two layers; one is an a-SiN$_x$:H film deposited over the semiconductor device, and the other is an a-Si:H film deposited over the a-SiN$_x$:H film. The composite film can not only be deposited at about 15° C. to 150° C., but also can prevent semiconductor devices from oxidation due to percolation of moisture, and maintain the electric properties and stability of the semiconductor devices as well.

Further applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 3 5(a), 5(b) shows the SIMS profile of a 15° C. PECVD a-Si:H under (a) air-exposure and (b) water-immersion for 60 days, respectively.

FIG. 7 shows the Si—O—Si 1070 cm$^{-1}$ IR peak absorption intensity as a function of water-boiling time for the 100°

C. PECVD a-SiN$_x$:H films with and without a 100° C. PECVD 20-nm a-Si:H coating.

FIGS. 8(*a*), 8(*b*) is a schematic diagram showing the inverted staggered a-Si:H TFT fabrication processes with (a) only a 100° C. 470-nm a-SiN$_x$:H passivation layer and (b) an additional 50-nm a-Si:H coating.

DETAILED DESCRIPTION OF THE INVENTION

According to the present invention, an a-SiN$_x$:H film is first deposited over a semiconductor device and then an a-Si:H film is deposited over the a-SiN$_x$:H film. The films are both deposited at 15° C. to 150° C.

The semiconductor device suitable for being coated with the low-temperature deposited passivation film of the present invention can be any semiconductor device which needs protection. Examples of such semiconductor devices include a silicon substrate, an a-Si:H thin film transistor and an a-Si:H thin film solar cell.

The a-SiN$_x$:H and a-Si:H films of the present invention can be deposited by any deposition which is applicable within the temperature range of 15° C. to 150° C. Chemical vapor deposition is more preferable. Representative examples of chemical vapor deposition include plasma-enhanced chemical vapor deposition (PECVD), low pressure CVD (LPCVD) and atmospheric pressure CVD (APCVD).

Generally speaking, if the low-temperature (15° C. to 150° C.) deposited a-SiN$_x$:H film is porous and cannot protect the semiconductor device from percolation of moisture in the air, i.e. will be oxidized in the air, then, according to the present invention, an a-Si:H film can be deposited at low temperatures (15° C. to 150° C.). The composite passivation film can thus effectively prevent the semiconductor device from oxidation.

It is also preferable that the a-SiN$_x$:H and a-Si:H films are deposited by the same PECVD system and at the same temperature, without breaking the vacuum in the system. Thus, the operation is more convenient and the deterioration of the products due to loading and unloading can be prevented.

It has been reported that for a semiconductor device having an a-Si:H active layer, the diffusion between the a-Si:H active layer and metal conductive layer interface occurs at temperatures below 180° C. For example, aluminum and a-Si:H diffuse at about 150° C., and gold and a-Si:H diffuse at an even lower temperature of 130° C.

Thus, for a semiconductor device having an a-Si:H active layer such as an a-Si:H thin film transistor and an a-Si:H thin film solar cell, the temperature for depositing a passivation film on the semiconductor device should not be too high. Moreover, when the source/drain metal or the conductive metal in the semiconductor device is a metal with low resistivity and high conductivity, such as aluminum, gold, copper, silver and alloys thereof, the temperature for depositing a passivation film should not be higher than 150° C. Since the composite passivation film can be deposited at about 15° C., to 150° C., and even below 100° C, the diffusion between the a-Si:H and the conductive metal layer interface can be effectively prevented, and the good electric properties of the semiconductor device can be maintained.

The thickness of the composite passivation film can be varied according to practical need. It is proven by the following examples that only a very thin layer (about 6.4 nm) of the a-Si:H film is needed to protect the semiconductor device from oxidation.

The following examples also prove that, on the silicon substrate, the 100° C.-deposited composite film including 470 nm a-SiN$_x$:H plus 6.4 nm a-Si:H will not be oxidized even when exposed to air for 14 months. Further, on the a-Si:H thin film transistor, the 100° C.-deposited composite film including 470 nm a-SiN$_x$:H plus 50 nm a-Si:H will not be oxidized even when exposed to air for 170 hours, and the OFF current of the a-Si:H thin-film transistor can still be maintained. This indicates that the a-SiN$_x$:H a-Si:H composite passivation film can effectively protect the silicon substrate and a-Si:H thin-film transistor from oxidation due to percolation of water.

The conditions for depositing a-SiN$_x$:H and a-Si:H films of the present invention are described as follows:

The chamber pressure and rf power density were set at 0.32 torr and 0.1 W/cm$^2$ respectively. The a-SiN$_x$:H film was deposited by SiH$_4$ and NH$_3$ with a gas flow ratio of SiH$_4$/NH$_3$=2/58. The a-Si:H film was deposited by SiH$_4$ with a gas flow of 6 sccm. The substrate temperature was varied from 15° C. to 300° C.

The a-SiN$_x$:H and a-Si:H films obtained from the following examples of the present invention can be analyzed by the instruments below:

An Applied Materials Ellipsometer II was used to measure the refractive index and thickness of the films. A Dektak 3030 surface profiler was also used to check the thickness of films. For monitoring the evolution of IR absorption peaks, a Perkin-Elmer 983G double-beam infrared (IR) spectrophotometer was used while the oxidation reaction was carried out. A CAMECA IMS-4f Secondary Ion Mass Spectrometer (SIMS) was also used to measure the chemical profile of the films. In order to monitor the bonding evolution during oxidation at elevated temperatures, a Lindberg three-zone furnace was used to anneal the a-Si:H films by flowing either N$_2$-carrying water steam or high-purity O$_2$ gas.

EXAMPLE 1

Figure 1:
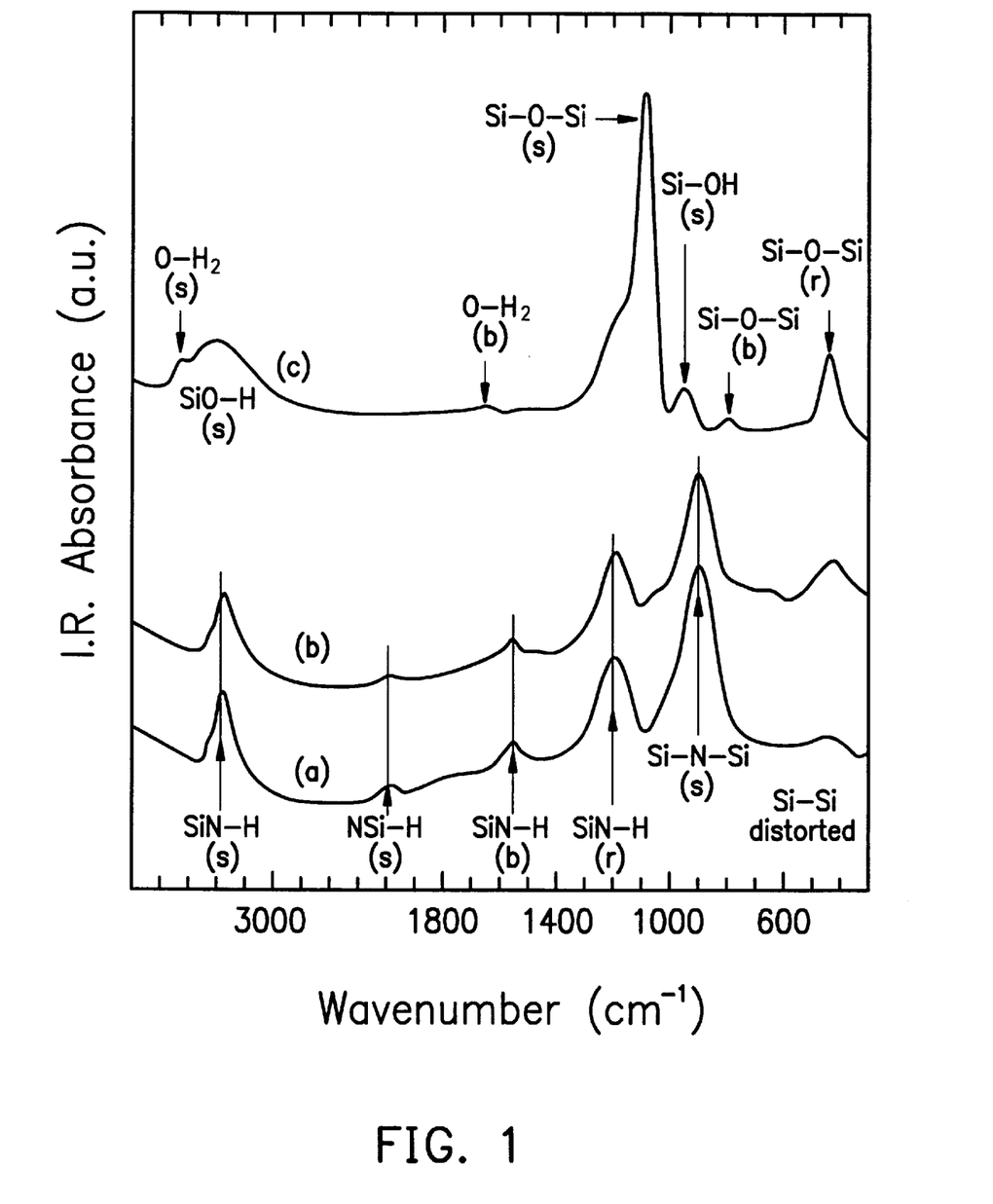
FIG. 1 shows the IR absorption spectra of (a) the as-deposited 100° C. PECVD a-SiN$_x$:H film, (b) the same sample with 6.4-nm coating of 100° C. PECVD a-Si:H after 14 months of air exposure, and (c) the already oxidized 100° C. PECVD a-SiN$_x$:H (without a-Si:H coating) after only 24 hours of air-exposure.

470 nm of a-SiN$_x$:H film was deposited on a p-type (100) Si substrate at 100° C. by PECVD according to the above-mentioned conditions. Once the film was deposited, the sample was taken out of the PECVD reaction chamber and analyzed by IR spectroscopy. The curve (a) of FIG. 1 represents the IR absorption spectrum of the film, which shows a pure amorphous nitride film. However, once this pure a-SiN$_x$:H film was placed in the air, it started to be oxidized as the air-exposing time proceeded. Eventually a fully oxidized film was formed after 24 hours' air-exposure, as shown in curve (c) of FIG. 1. It is clear that all of the Si—N—Si, SIN—H, NSi—H and —Si—Si— distorted bonds disappear eventually with the formation of more chemically stabilized Si—O—Si, SIO—H and H—O—H bonds.

EXAMPLE 2

Figure 2:
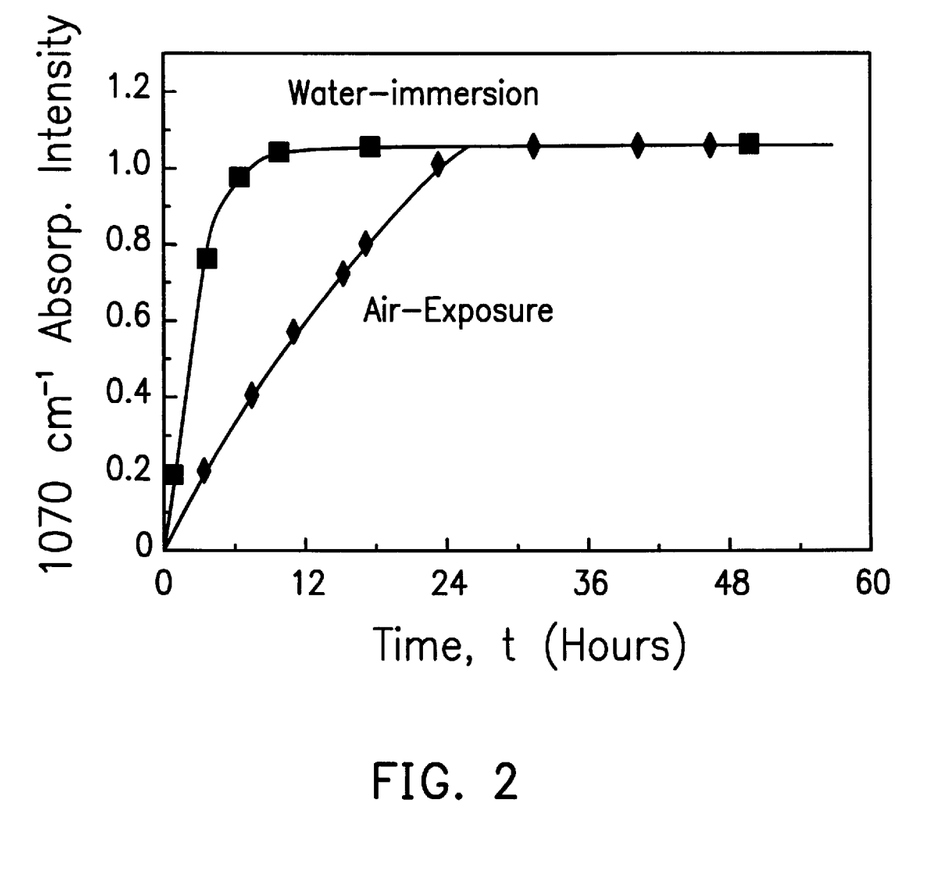
FIG. 2 shows the Si—O—Si 1070 cm$^{-1}$ IR peak absorption intensity as a function of air-exposing and water-immersing hours for the 100° C. 910-nm PECVD a-SiN$_x$:H films.

910 nm of a-SiN$_x$:H film was deposited on a Si substrate at 100° C. by PECVD according to the above-mentioned conditions. Once taken out from the reactor chamber, the sample was immediately immersed in water or placed in the air. The IR absorption intensity pertaining to the most significantly Si—O—Si stretching vibration mode at 1070 cm$^{-1}$ was plotted in FIG. 2 as a function of either air-exposing or water-immersing hours, respectively. For air-exposure, about 26 hours(~1 day) were needed to reach saturation; whereas for water-asmpersion, only about 8 hours (⅓ day) were necessary. This is because the H$_2$O concentration in the air is relatively smaller than that of the liquid water. Thus for the film exposed in the air, H$_2$O has lesser chance to percolate into the film.

EXAMPLE 3

Figure 3:
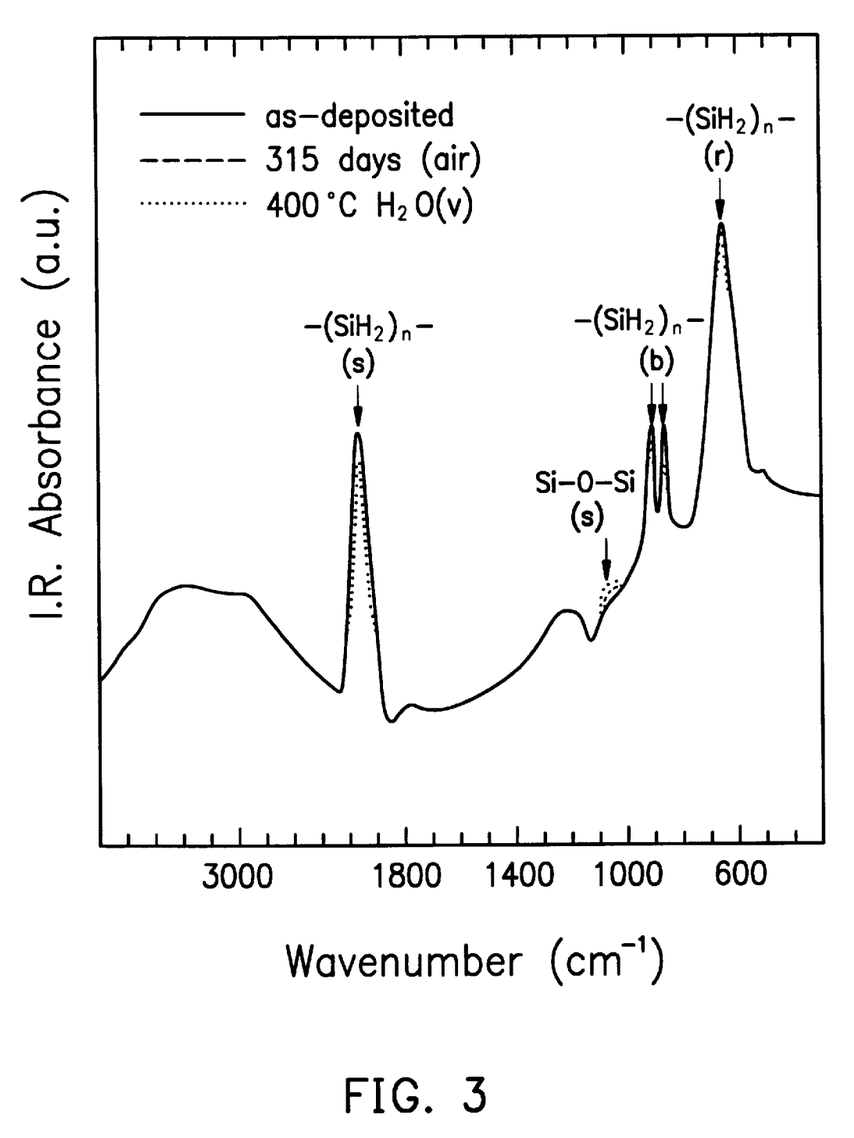
FIG. 3 shows the IR absorption spectrum of the as-deposited 15° C. 435-nm PECVD a-Si:H film (the solid curve), and the dashed and dotted curves represent the IR spectra after 315 days of air-exposure and 400° C. H$_2$O vapor annealing, respectively.

435 nm of a-Si:H film was deposited on a Si substrate at 15° C. by PECVD according to the above-mentioned conditions. The dashed curve in FIG. 3 shows that after 10 months (315 days) of air-exposure, only a very small amount of Si—O—Si stretching peak (1070 cm$^{-1}$) was distinguishable by the IR spectroscopy, indicating that only a very small portion of this 15° C. sample was oxidized. Also, for the same 15° C. a-Si:H samples under water-immersion, only very small amounts of 1070 cm$^{-1}$ peaks eventually appear. Therefore, the lower-temperature (15° C.) deposited a-Si:H film can effectively protect the Si substrate against oxidation both in the air and in water.

Figure 5:
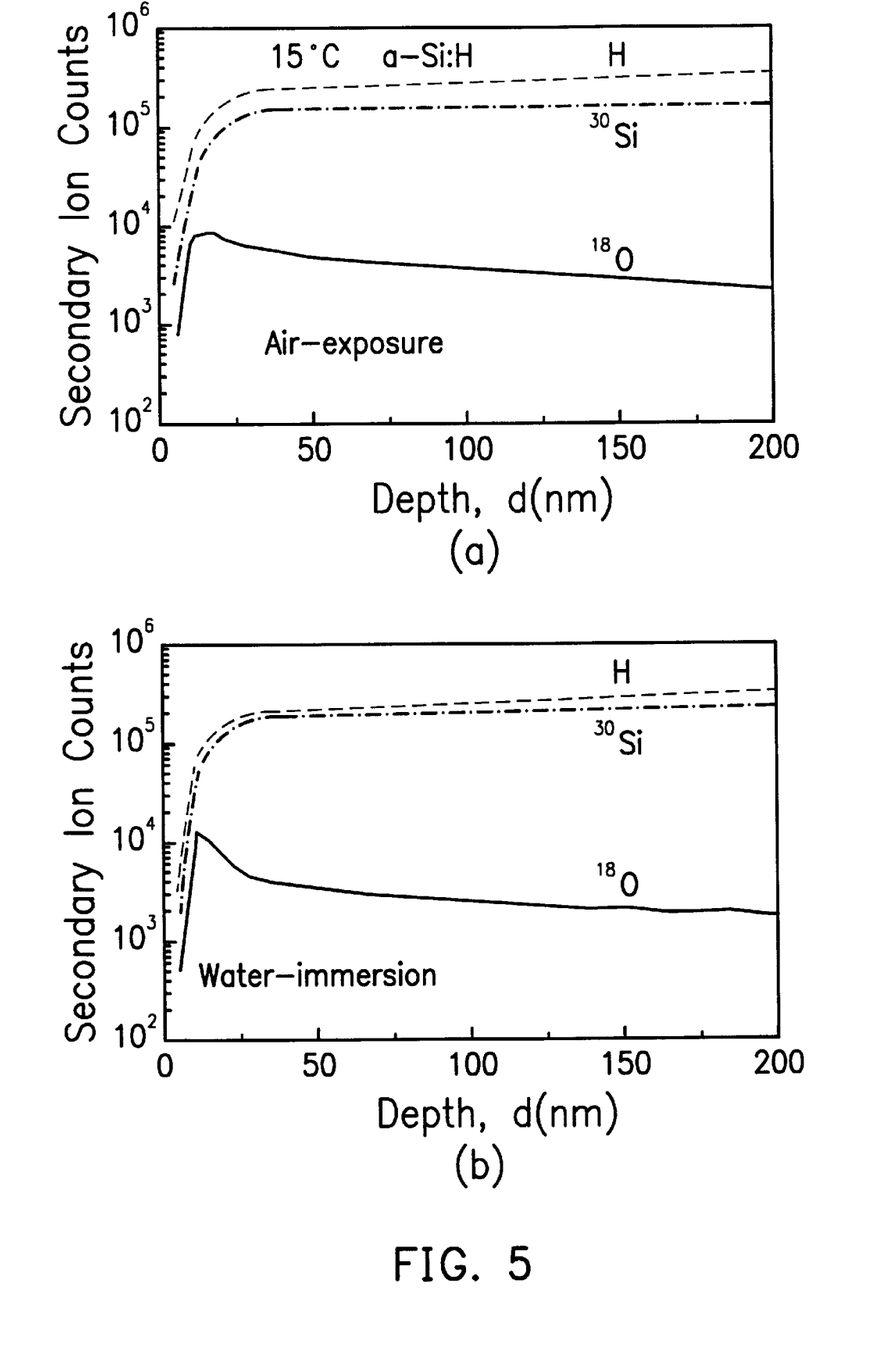

In order to estimate the oxidation-resistant strength of the 15° C. a-Si:H film, the film was immersed in 98° C. boiling water for 45 min and then blown dry by high-purity nitrogen for immediate IR measuring. The spectrum of this film exhibited the same features as that taken before water-boiling. Subsequently, the same sample was heated in an annealing furnace by flowing steam at several elevated temperatures of 150° C., 200° C., 300° C., 400° C. and 500° C. for 15 minutes, respectively. The IR spectra taken after each annealing at 150° C., 200° C., and 300° C. were the same; while the 400° C. spectrum, which is drawn as the dotted curve in FIG. 5, showed a small decay of all —(SiH$_2$)$_n$— related peaks and an increase of Si—O—Si 1070 cm$^{-1}$ peak. Furthermore, for the 500° C. spectrum, all the originally strong —(SiH)$_n$— peaks disappeared but the growth of Si—O—Si 1070 cm$^{-1}$ was still indistinguishable. Also, for other 15° C. samples annealed in a high-purity O$_2$ environment, the similar spectra were observed at the same temperature range. This means that the oxidation of a-Si:H after 400° C. annealing is independent of the oxidant source of either H$_2$O or O$_2$, whose activation energies are different, i.e. H$_2$O is more reactive than O$_2$ to oxidize a-Si:H films.

EXAMPLE 4

Figure 4:
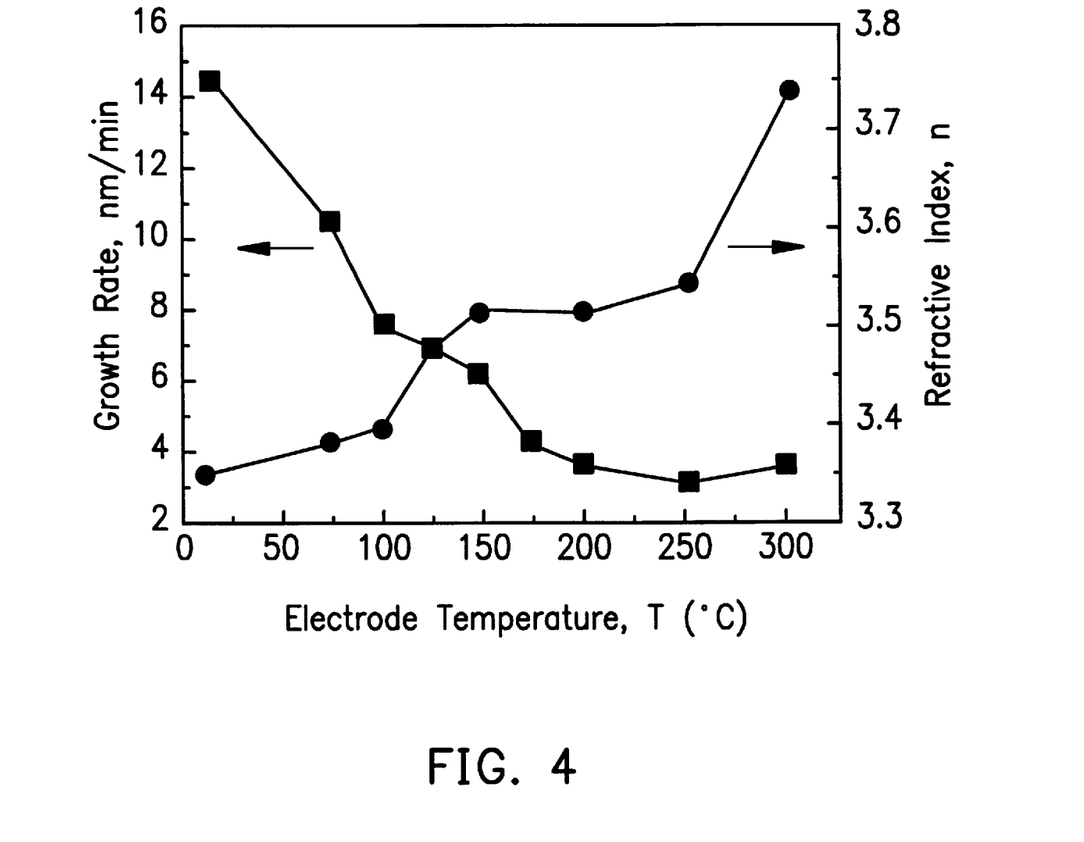
FIG. 4 shows the growth rates and the refractive indices of a-Si:H films as a function of electrode temperatures.

According to the above-mentioned conditions, a-Si:H film was deposited at various temperature from 15° C.–300° C. The growth rates and refractive indices of a-Si:H versus various PECVD electrode temperatures are plotted in FIG. 4. It is clear that once the deposition temperature is elevated from 15° C. to 300° C., the growth rate decreases from 14.5 to 3.8 nm/min; on the other hand, the refractive index increases from 3.3 to 3.74. These indicate that the low-temperature PECVD a-Si:H material possesses a porous structure and its porosities decrease with the elevating of deposition temperature. For the 300° C.-deposited a-Si:H film, the refractive index was 3.74, which is close to that of crystalline silicon, 3.89.

EXAMPLE 5

According to the above-mentioned conditions, 435 nm of a-Si:H film was deposited at 15° C. In order to measure the extremely small amounts of —Si—Si— and Si—H oxidation in a-Si:H films, the 15° C.-deposited a-Si:H samples were air-exposed and water-immersed, respectively, at room temperature for 2 months (60 days). Once they reached oxidation-saturation, the SIMS profile was measured. FIG. 5 shows the measured SIMS profile of $^{18}$O, $^{30}$Si and H for two 15° C. a-Si:H samples under 60 days' air-exposure (FIG. 5(a)) and water-immersion (FIG. 5(b)), respectively. It can be found that the secondary ion counts of $^{30}$Si and H in the two a-Si:H films were relatively high as a whole and remained constant, except that at a depth of about 10 nm from the surface, where the secondary ion counts are less. On the other hand, the secondary ion counts of $^{18}$O in the two a-Si:H films are relatively low as a whole, except that at a depth of about 10 nm from the surface, the secondary ion counts were greater. This indicates Hat after the air-exposure or water-immersion, only the area within the depth of about 10 nm from the surface of the a-Si:H films was percolated or oxidized by the water molecules. However, the a-Si:H film as a whole was not affected by the water molecules. This proves that the low-temperature (15° C.) deposited a-Si:H film, as a whole, is waterproof.

EXAMPLE 6

Figure 6:
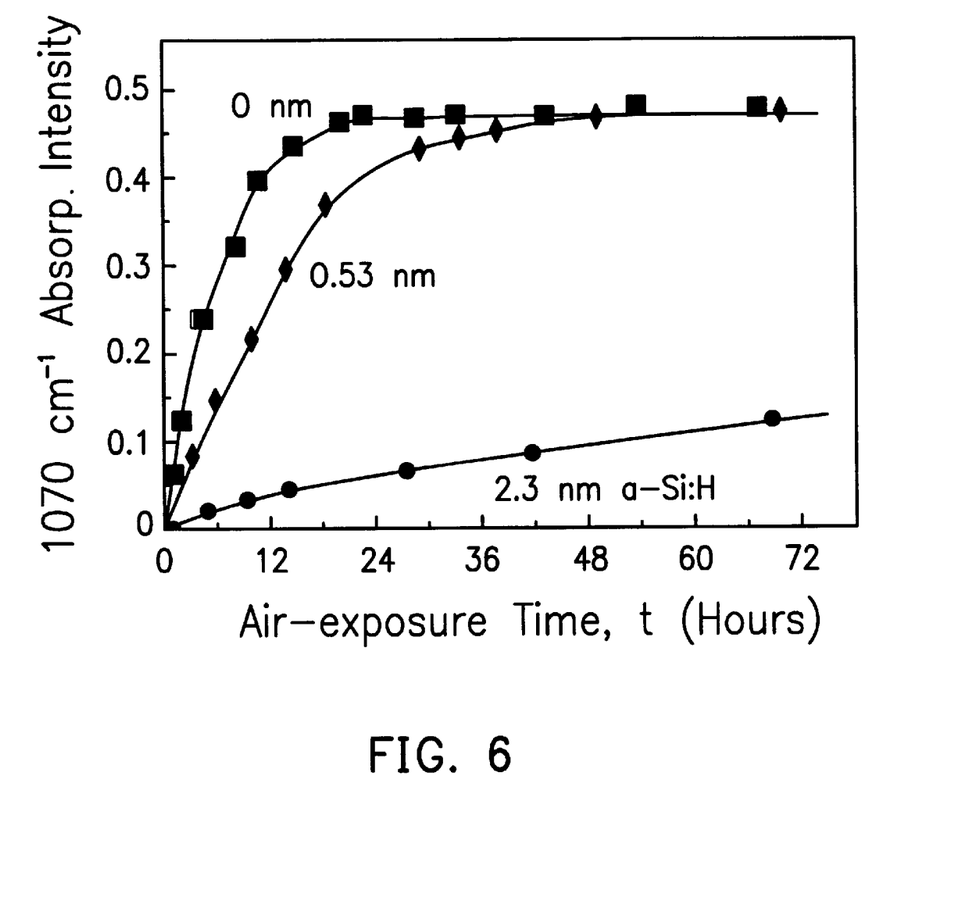
FIG. 6 shows the Si—O—Si 1070 cm$^{-1}$ IR peak absorption intensity as a function of air-exposing hours for the 100° C. a-SiN$_x$:H films with 0, 0.53 and 2.3 nm a-Si:H coatings.

According to the above-mentioned conditions, 470 nm of a-SiN$_x$:H film was deposited at 100° C. Then, various thicknesses of a-Si:H film (0.53 nm, 2.3 nm, and 6.4 nm) were respectively deposited on the a-SiN$_x$:H film at the same PECVD temperature. FIG. 6 plots the IR absorption intensity of the characteristic Si—O—Si 1070 cm$^{-1}$ peak of the as-deposited 470-nm 100° C. a-SiN$_x$:H and its a-Si:H coatings of various thicknesses, i.e., 0, 0.53 and 2.3 nm, respectively, as a function of air-exposing time. For the a-SiN$_x$:H film without a-Si:H coating, only about 20 hours were needed to reach oxidation-saturation, but for the same sample with a very thin layer of 0.53 nm a-Si:H coating, a longer time of about 50 hours was needed to reach its saturation of oxidation. FIG. 6 also shows that for the same a-SiN$_x$:H film with thicker a-Si:H coating (2.3 nm), a drastically slower oxidation rate was exhibited and saturation took much longer, 15 days.

Moreover, when the as-grown 100° C. a-SiN$_x$:H film was coated with a even thicker 100° C. a-SiH film (6.4 nm) under the same PECVD system without breaking the vacuum, this composite film could resist oxidation even after 14 months or air-exposure, as shown in curve (b) of FIG. 1. This means that at room temperature, H$_2$O (moisture) molecules from air or from water cannot percolate through this 100° C. 470 nm a-SiN$_x$:H plus 6.4 nm a-Si:H composite coating.

EXAMPLE 7

Figure 7:
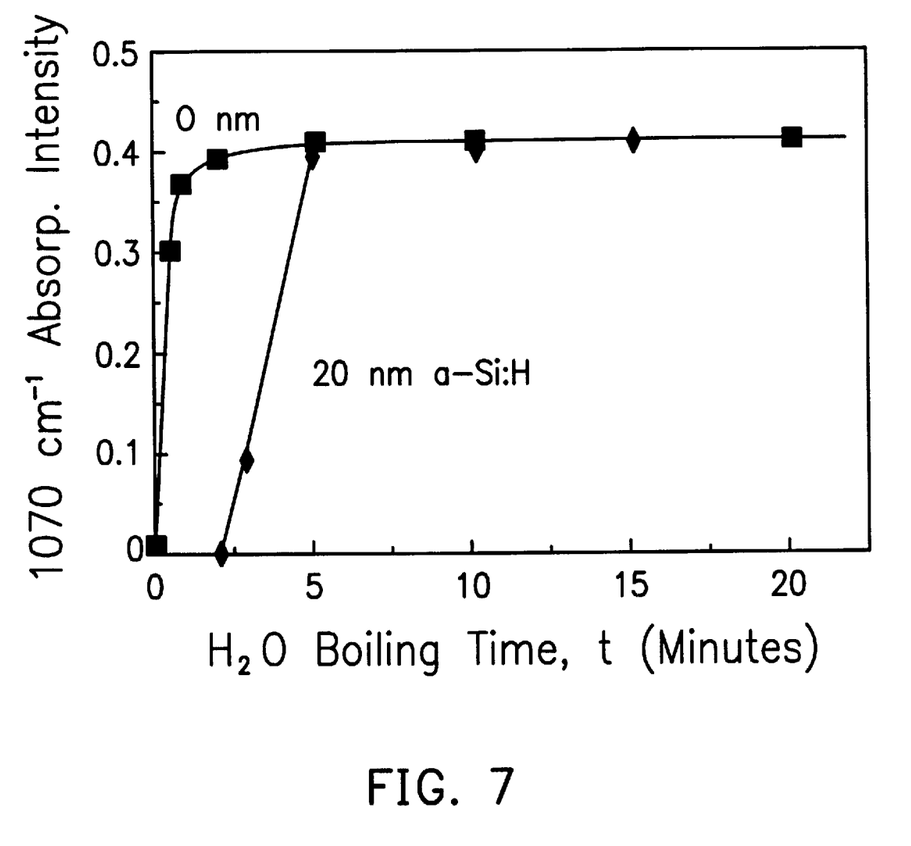

The composite films with a 470 nm a-SiN$_x$:H layer and various thicknesses of a-Si:H layer (0, 9, 20, and 30 nm) were immersed in 98° C. boiling water for certain time intervals and then immediately blown dry by high-purity N$_2$ gas for subsequent IR measurings. The Si—O—Si 1070 cm$^{-1}$ peak absorption intensity was then plotted as a function of water-boiling time in FIG. 7. For the 100° C. deposited 470 nm of a-SiN$_x$:H layer without a-Si:H coating (indicated as 0 nm in the figure), 30-second water-boiling results in 70% oxidation and 1-minute water-boiling results in 90% oxidation; while, for that with 9 nm a-Si:H coating, the measured IR spectrum showed no signs of oxidation even after 1 minute of water-boiling. Composite films with a thicker a-Si:H coating (20 nm) resisted oxidation after 2 minutes of water-boiling, and the 20 nm a-Si:H coating film was fully oxidized after 5 minutes of water-boiling. When the a-Si:H coating was deposited to 30 nm, even when the composite film was immersed in 98° C. boiling water for 16 minutes, the IR spectrum was still the same as the curve (b) of FIG. 1, i.e. no oxidation occurred. This indicates that when the a-Si:H coating is 30 nm, the coating is very strong waterproof.

EXAMPLE 8

Figure 8:
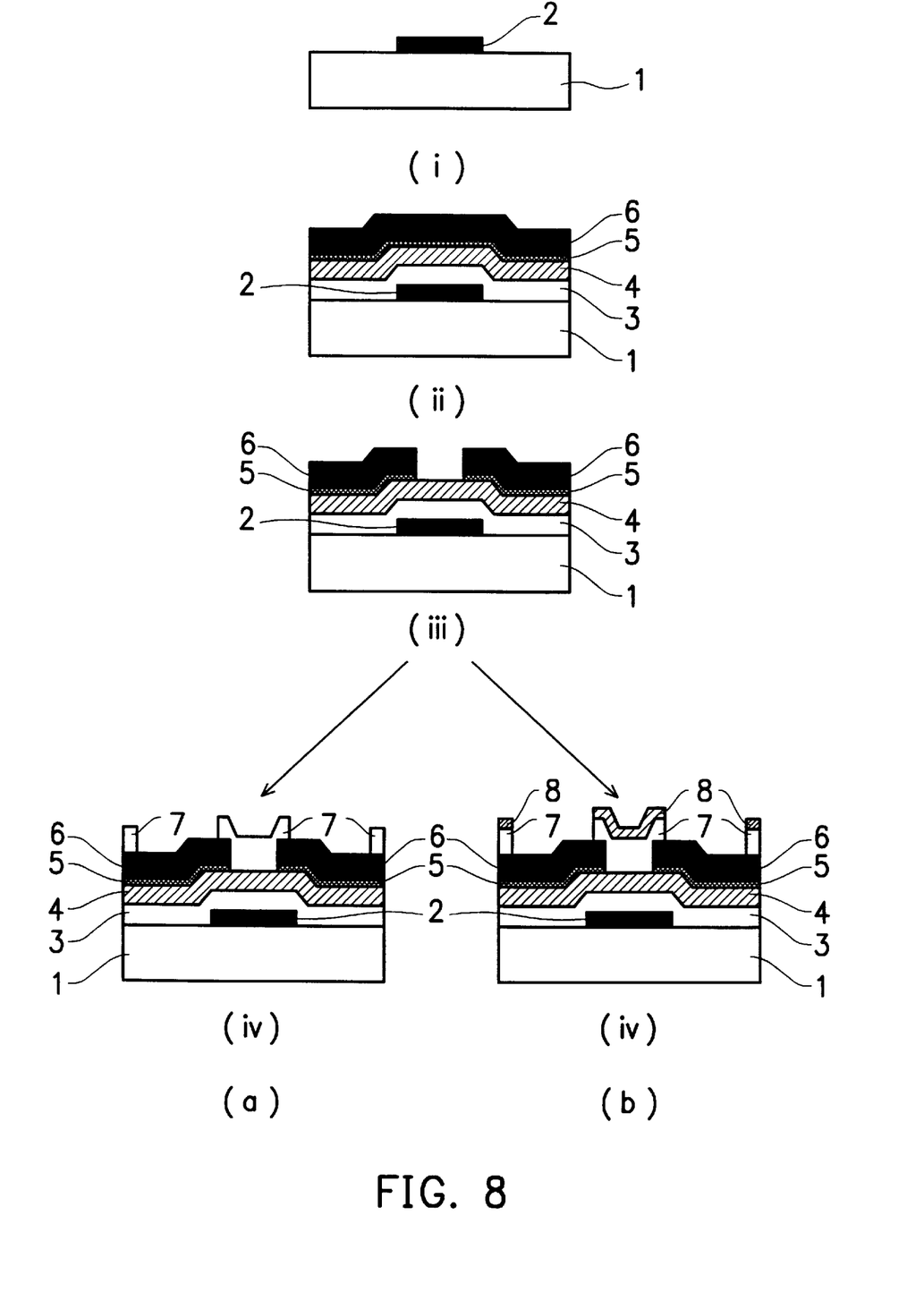

FIG. 8 shows the fabrication process of a traditional inverted staggered a-Si:H TFT. First, the Al-1% Si metal was thermally evaporated onto a 7059 glass 1 and patterned by wet etching to form a gate line 2. Then, the gate insulator layer 3 of 450-nm a-SiN$_x$:H was grown by PECVD at 300° C. Without breaking the PECVD vacuum system, a 250-nm intrinsic (i-type) layer 4 and a 50-nm n-type a-Si:H layer 5 were deposited continuously. Later on, a layer of 200-nm Al-1% Si was thermally evaporated onto the samples and patterned by wet etching to form the source/drain (S/D) electrodes 6. The n-type a-Si:H contact layer was removed by reactive ion etching (RIE) using the S/D photoresist (PR) pattern as the mask (see Fig. 8(iii)).

Subsequently, these a-Si:H TFTs were divided into two groups, one with the passivation of a PECVD 100° C. a-SiN$_x$:H layer 7 (see FIG. 8(a) (iv)) and the other with the passivation of a double layer, i.e. with a PECVD 100° C. a-SiN$_x$:H layer 7 and an additional 50-nm 100° C. a-Si:H coating 8 (see FIG. (b) (iv)). The growth conditions of the passivation films were the same as mentioned above. Finally, the contact windows were opened to define the source, drain and gate electrodes.

Figure 9:
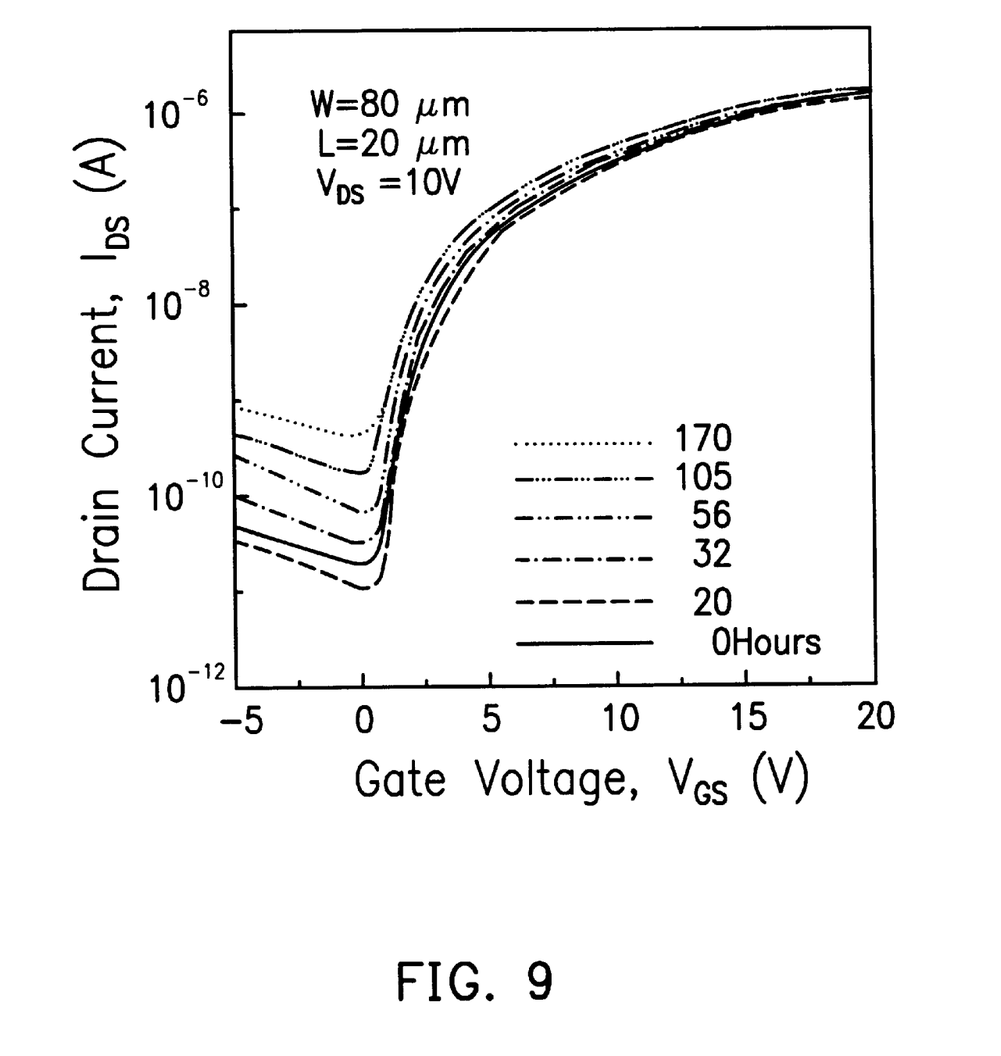
FIG. 9 shows the transfer characteristics of $I_{DS}$ versus $V_{GS}$ with a drain to source voltage of 10 V for TFT's with a 100° C. 470-nm a-SiN$_x$:H passivation layer after a certain amount of air-exposure. The channel size is width/length= 80/20 μm.
Figure 10:
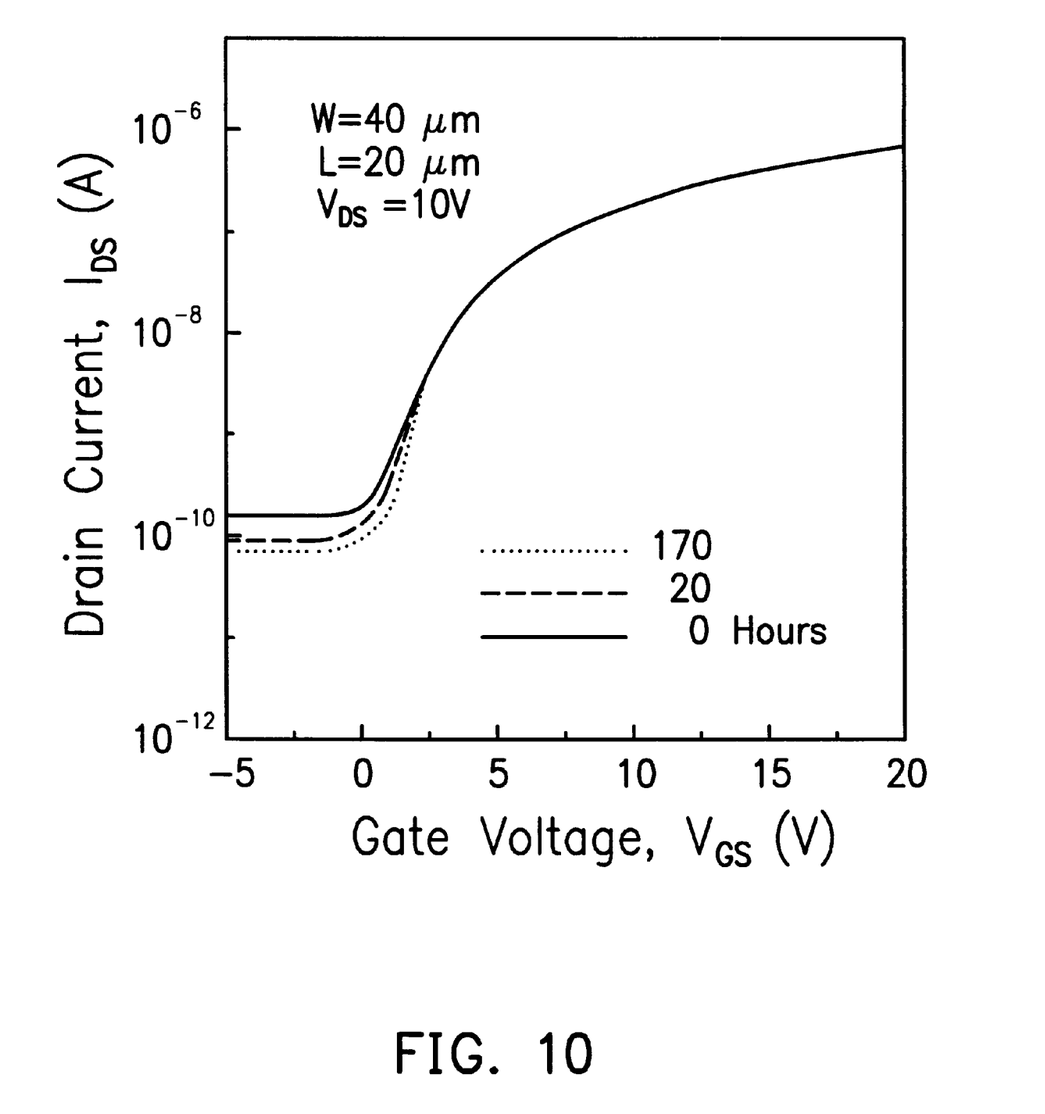
FIG. 10 shows the transfer characteristics of $I_{DS}$ versus $V_{GS}$ with a drain to source voltage of 10 V for the a-Si:H TFTs with a 100° C. 470-nm a-SiN$_x$:H passivation layer coated by an additional 50-nm a-Si:H layer after a certain amount of air-exposure. The channel size is width/length= 40/20 μm.

In order to monitor the effect of air moisture upon the low-temperature PECVD a-SiN$_x$:H passivation layer with or without a PECVD a-Si:H coating, two sets of a-Si:H TFT devices were fabricated and their OFF currents were measured at IC certain time intervals while being exposed to air. FIGS. 9 and 10 plot the drain current versus gate bias ($I_{DS}$-$V_{GS}$) of the a-Si:H TFT devices covered by a 100° C. 470-nm a-SiN$_x$:H passivation layer without and with a 100° C. a-Si:H coating under air-exposure, respectively.

In FIGS. 9 and 10, both devices show improved OFF currents (the current is decreased) for the first 20 hours of air exposure. Since the moisture from the air gradually oxidize, the a-SiN$_x$:H film in a layer-by-layer fashion, it takes at least about 20 hours for the H$_2$O molecules to percolate and reach the bottom interface of this 470-nm nitride film. Hence, it is possible that during the initial 20 hours of air exposure, H$_2$O molecules don't have enough time to percolate throughout this 100° C. a-SiN$_x$:H passivation layer and reach the top surface of the a-Si:H active layer.

Referring to FIG. 9, after between 32 hours and 170 hours of air-exposure, the TFT with a single passivation layer of a-SiN$_x$:H exhibits a continuous degradation of the OFF currents (i.e. the current is increased). On the other hand, referring to FIG. 10, it is clear that the TFT with a composite passivation layer of a-SiN$_x$:H and a-Si:H doesn't show any tendency to degrade. The OFF current stays at about 1.5× 10$^{-10}$ A and finally reaches an even lower 8×10$^{-11}$ A after 170 hours (~7 days) of air-exposure during the same time interval. This indicates that with a single passivation layer of a-SiN$_x$:H, the a-Si:H TFT cannot be effectively protected. However, a composite layer of a-SiN$_x$:H and a-Si:H can effectively protect the a-Si:H TFT from degradation caused by the percolation of moisture.

What is claimed is:

1. A composite passivation film, suitable for being formed over a semiconductor device, comprising a hydrogenated amorphous silicon nitride (a-SiN$_x$:H) film deposited over the semiconductor device and an amorphous silicon hydrogen (a-Si:H) film deposited over the a-SiN$_x$:H film as an outermost film, wherein the films are deposited at about 15° C. to 150° C.

2. The composite passivation film of claim 1, wherein the a-SiN$_x$:H film is deposited by SiH$_4$ and NH$_3$ with a gas flow ratio SiH$_4$/NH$_3$ of 2/58.

3. A semiconductor device with a composite passivation film, comprising a semiconductor device; an a-SiN$_x$:H.

4. The semiconductor device with a composite passivation film as claimed in claim 3, wherein the semiconductor device is a silicon substrate.

5. The semiconductor device with a composite passivation film as claimed in claim 3, wherein the semiconductor device is an a-Si:H thin-film transistor.

6. The semiconductor device with a composite passivation film as claimed in claim 3, wherein the semiconductor device is an a-Si:H thin-film solar cell.

7. The semiconductor device with a composite passivation film as claimed in claim 3, wherein the composite passivation film is deposited by chemical vapor deposition (CVD).

8. The semiconductor device with a composite passivation film as claimed in claim 7, wherein the composite passivation film is deposited by plasma-enhanced CVD (PECVD), low pressure CVD (LPCVD), or atmospheric pressure CVD (APCVD).

9. The semiconductor device with a composite passivation film as claimed in claim 8, wherein the composite passivation film is deposited by plasma-enhanced CVD (PECVD).

10. The semiconductor device with a composite passivation film as claimed in claim 9, wherein the a-SiN$_x$:H and a-Si:H films are deposited by the same PECVD system and at the same temperature, without breaking the vacuum in the system.

11. The semiconductor device with a composite passivation film as claimed in claim 5, wherein the source/drain metal in the a-Si:H thin film transistor is aluminum, gold, silver, copper or an alloy thereof.

12. The semiconductor device with a composite passivation film as claimed in claim 11, wherein the source/drain metal in the a-Si:H thin film transistor is aluminum or an aluminum alloy.

13. The semiconductor device with a composite passivation film as claimed in claim 3, wherein the semiconductor device has an a-Si:H layer.

14. The semiconductor device with a composite passivation film as claimed in claim 13, wherein one conductive metal layer in the semiconductor device is aluminum, gold, silver, copper or an alloy thereof.

15. The semiconductor device with a composite passivation film as claimed in claim 14, wherein one conductive metal layer in the semiconductor device is aluminum or an aluminum alloy.

16. The semiconductor device with a composite passivation film as claimed in claim 3, wherein the a-Si:H film has a thickness of equal to or more than 6.4 nm.

17. The semiconductor device of claim 3, wherein the a-SiN$_x$:H film is deposited by SiH$_4$ and NH$_3$ with a gas flow ratio SiH$_4$/NH$_3$ of 2/58.

18. A semiconductor device protected against oxidation due to a percolation of moisture, comprising a semiconductor device having a plurality of active layers; and a passivation composite applied over the semiconductor device, the composite being formed by an a-SiN$_x$:H film deposited over the semiconductor device and an a-Si:H film deposited over the a-SiN$_x$:H film as an outermost film, wherein the a-SiN$_x$:H and a-Si:H films are deposited at a temperature of between about 15° C. to 150° C.

* * * * *